United States Patent
Jaeckel

(10) Patent No.: US 11,313,901 B2
(45) Date of Patent: Apr. 26, 2022

(54) TRIMMING ANALOG CIRCUITS

(71) Applicant: Smart Prong Technologies, Inc., Irvine, CA (US)

(72) Inventor: Silvia Jaeckel, Irvine, CA (US)

(73) Assignee: SMART PRONG TECHNOLOGIES, INC., Irvine, CA (US)

( * ) Notice: Subject to any disclaimer, the term of this patent is extended or adjusted under 35 U.S.C. 154(b) by 276 days.

(21) Appl. No.: 16/708,220

(22) Filed: Dec. 9, 2019

(65) Prior Publication Data

US 2021/0173002 A1    Jun. 10, 2021

(51) Int. Cl.
*G01R 31/3187*     (2006.01)
*G01R 31/28*     (2006.01)
*G01R 31/319*     (2006.01)

(52) U.S. Cl.
CPC ..... *G01R 31/2886* (2013.01); *G01R 31/3191* (2013.01); *G01R 31/31915* (2013.01)

(58) Field of Classification Search
CPC ...... G01R 31/28; G01R 31/30; G01R 31/303; G01R 31/316; G01R 31/3191; G01R 31/31915; G01R 31/31908; G01R 31/3167; G01R 31/31703; G01R 31/2886; G01R 31/2856; G01R 31/2879; G01R 31/2822
See application file for complete search history.

(56) References Cited

U.S. PATENT DOCUMENTS

| | | | | |
|---|---|---|---|---|
| 7,433,790 B2* | 10/2008 | Anderson | .......... | G01R 31/3167 374/171 |
| 7,852,099 B1* | 12/2010 | Clark | ............... | G01R 31/31908 324/762.02 |
| 8,929,158 B1* | 1/2015 | Wang | ................... | G11C 29/021 365/189.09 |
| 10,297,558 B1* | 5/2019 | Shieh | .................. | H01L 23/5256 |
| 2013/0316653 A1* | 11/2013 | Kyles | ..................... | H04B 17/21 455/67.11 |
| 2018/0323703 A1* | 11/2018 | Park | ........................ | H02M 3/07 |

* cited by examiner

*Primary Examiner* — Thang X Le

(74) *Attorney, Agent, or Firm* — Viering Jentschura & Partner mbB

(57) ABSTRACT

A system may include a trim circuit configured to provide a trim signal to a circuit under test. The trim circuit may be configured to adjust a trim value of the trim signal based on a selection signal and a value signal. The trim signal may cause a key characteristic of the circuit under test to change based on the adjusted trim value. The system may include a production tester configured to determine whether the key characteristic is within a threshold range. Responsive to the key characteristic being within the threshold range, the production tester may stop performing the trim procedure on the circuit under test. Responsive to the key characteristic not being within the threshold range, the production tester may adjust the value signal based on whether the key characteristic is greater than or less than the threshold range.

20 Claims, 6 Drawing Sheets

TRIMMING ANALOG CIRCUITS

FIELD

The embodiments discussed in the present disclosure are related to trimming analog circuits.

BACKGROUND

During manufacturing of integrated circuits that include analog components, process variations may occur within the analog components. The process variations may cause one or more characteristics within the integrated circuits to be outside operational tolerances and the integrated circuits may operate improperly. To ensure that the integrated circuits operate properly, trim procedures may be performed to adjust one or more of the characteristics of the analog components to be within operational tolerances.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

One or more embodiments of the present disclosure may include a system for performing a trim procedure on a circuit under test. The system may include a trim circuit. The trim circuit may be configured to provide a trim signal to a circuit under test. The trim circuit may also be configured to adjust a trim value of the trim signal. The trim value of the trim signal may be adjusted based on a selection signal and a value signal. The trim signal may cause a key characteristic value of the circuit under test to change based on the adjusted trim value. The system may also include a production tester. The production tester may be configured to determine whether the key characteristic value is within a threshold range. Responsive to the key characteristic value being within the threshold range, the production tester may stop performing the trim procedure on the circuit under test. Responsive to the key characteristic value not being within the threshold range, the production tester may adjust the value signal. The value signal may be adjusted based on whether the key characteristic value is greater than or less than the threshold range.

One or more embodiments of the present disclosure may include a method for performing a trim procedure on a circuit under test. The method may include receiving a selection signal and a value signal. The method may also include providing a trim signal to a circuit under test. In addition, the method may include adjusting a trim value of the trim signal. The trim value of the trim signal may be adjusted based on the selection signal and the value signal. The trim signal may cause a key characteristic value of the circuit under test to change based on the adjusted trim value. Further, the method may include determining whether the key characteristic value is within a threshold range. Responsive to the key characteristic value being within the threshold range, the method may include stopping performance of the trim procedure on the circuit under test. Responsive to the key characteristic value not being within the threshold range, the method may include adjusting the value signal. The value signal may be adjusted based on whether the key characteristic value is greater than or less than the threshold range.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DETAILED DESCRIPTION

Figure 1:
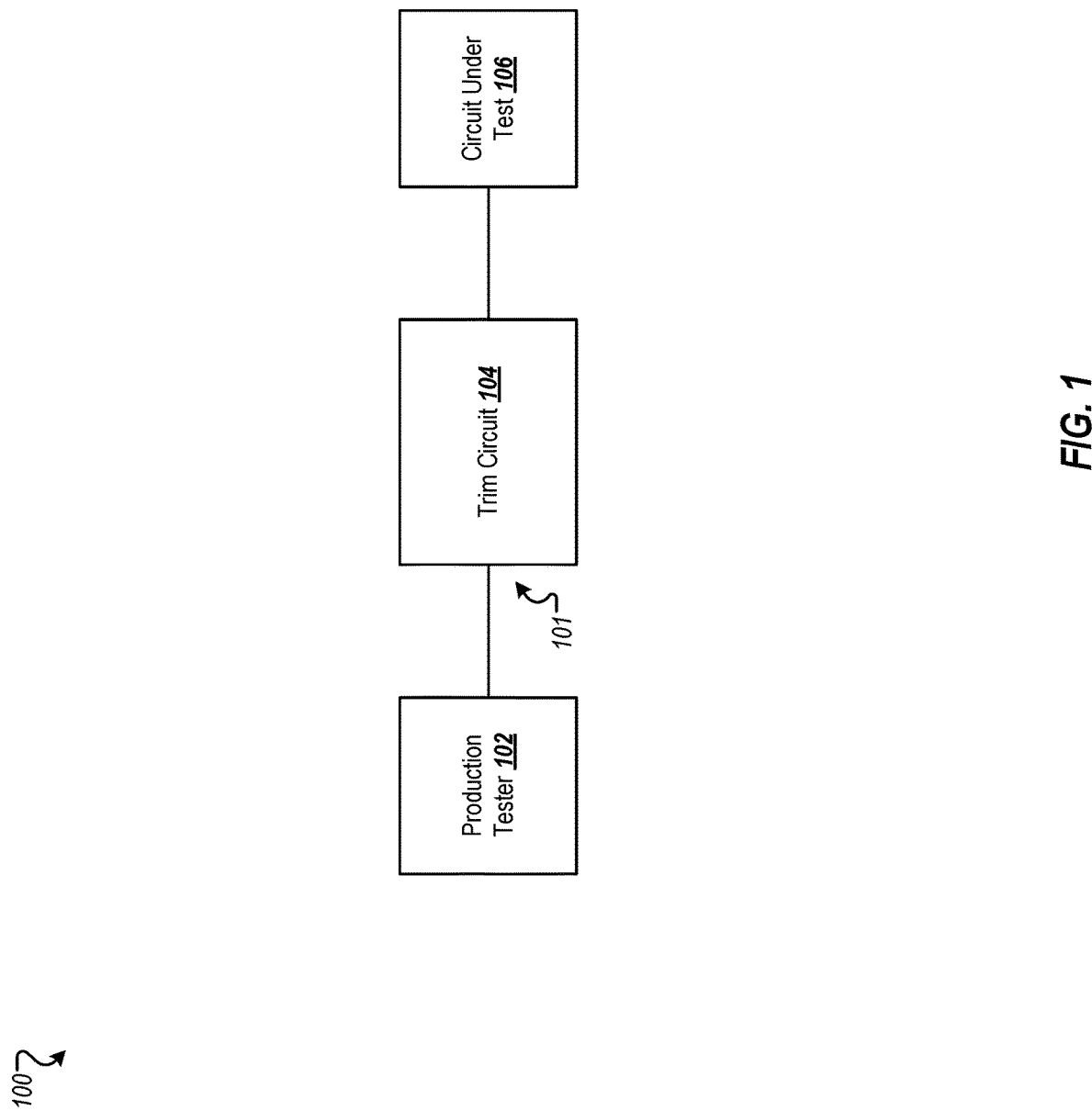
FIG. 1 illustrates an example system for trimming one or more characteristics of a circuit under test.

Integrated circuits may include analog components that during manufacturing experience process variations. An impact of the process variations on the integrated circuits may be different on each die. The process variations may cause one or more characteristic values of the analog components to fall outside of operational parameters (e.g., a threshold range). For example, an analog oscillator circuit may be designed to generate an analog clock signal with a frequency of ten Megahertz (MHz). During production, the analog oscillator circuit may actually generate the analog clock signal at a frequency other than ten MHz (e.g., eight and a half MHz).

To ensure that the integrated circuit properly operates, trim procedures may be performed on one or more of the characteristics of the integrated circuits to adjust the characteristic value (e.g., a key characteristic value) to be within the threshold range. For example, the trim procedures may be performed to alter (e.g., trim) a voltage, a current, a frequency, or any other appropriate characteristic of analog components. In some embodiments, the various characteristic values may be altered such that the characteristic values are within the threshold range to ensure proper operation of the integrated circuits.

A production tester may be coupled to the integrated circuit and interface to a circuit under test (e.g., the analog components) and to one or more digital components (e.g., a trim circuit). The production tester may provide one or more signals to the trim circuit. In addition, the production tester may measure the key characteristic value of the analog component. The trim circuit may generate a trim signal at a trim value based on the one or more signals from the production tester. The trim circuit may provide the trim signal to the circuit under test. The circuit under test may be configured to alter the key characteristic value based on the trim signal. For example, the trim signal may indicate that the key characteristic value is to increase and the circuit under test may change various aspects of corresponding analog components to cause the key characteristic value to increase. As another example, the trim signal may indicate that the key characteristic value is to decrease and the circuit under test may change various aspects of corresponding analog components to cause the key characteristic value to decrease. When the key characteristic value is within the corresponding threshold range (e.g., the range of operational tolerance), the trim procedure may be stopped (e.g., end).

In some integrated circuit technologies, registers may store the trim values of the trim signal and a register interface may be implemented to change the trim value of the trim signal (e.g., the value indicating a degree to which the key characteristic value is to be altered). In these and other integrated circuit technologies, multiple clock pulses of clock signals may be used each time the trim value is to be altered. For example, in some trimming technologies employing serial register access interfaces, twenty clock pulses may be used to alter the trim value a single time. Using multiple clock pulses each time the trim value is to be altered may increase an amount of time used to perform the trim procedure and thus increase production overhead by increasing production test time.

In some integrated circuit technologies, the analog components may be manufactured and implemented without performing any trim procedure. These integrated circuit technologies may cause the key characteristic values to be imprecise and operational inconsistencies within the integrated circuits may occur.

In some integrated circuit technologies, an embedded processor may be used to perform the trim procedure. In these integrated circuit technologies, special trim firmware may be uploaded on the embedded processor, which may increase production test time. In these integrated circuit technologies, a size of a memory (e.g., a read only memory (ROM)) portion of the embedded processor may increase to properly save the special trim firmware. In addition, in these integrated circuit technologies, trim procedures executed by the embedded processor may be fixed and may not be customizable or alterable for a particular analog component or the integrated circuits.

In some integrated circuit technologies, the trim circuit may be omitted, and the trim value may be provided solely by external devices (e.g., the production tester). In these and other integrated circuit technologies, a number of circuit pads may be greater than integrated circuit technologies that include the trim circuit. In the case of pad-limited integrated circuits, this may result in a larger die footprint than in an integrated circuit technology that includes the trim circuit.

Some of these integrated circuit technologies may increase production overhead (e.g., testing time, circuit footprints, or both testing time and circuit footprints) for each integrated circuit that is manufactured. Therefore, a need exists for systems and methods for trimming analog circuits that reduce production overhead.

According to some embodiments described in the present disclosure, production overhead may be reduced compared to these integrated circuit technologies. For example, in some embodiments described in the present disclosure, trim procedures may be performed using the production tester and the trim circuit. A reset signal may be provided by the production tester to the trim circuit. Various components within the trim circuit (e.g., one or more storage elements) may reset to a pre-programmed initial value based on the reset signal. In these and other embodiments, the trim value of the trim signal may be provided to the circuit under test at an initial value. In some embodiments, the trim value may be based on a current value stored in a corresponding storage element. The current value stored in the corresponding storage element may be based on a selection signal (e.g., a signal indicating that the trim procedure is to be performed), the reset signal (e.g., the initial value of the trim value), a value signal (e.g., a signal indicating whether the trim value is to increase or decrease), and/or a storage control signal. For example, the current value may be changed to be one or more digital steps above or below the initial value of the trim value due to the value signal indicating that the trim value is to increase or decrease.

In some embodiments, a size of the digital steps may correspond to a number of bits of the trim signal. In these and other embodiments, the size of the digital steps may be a digital value of 1. Alternatively, the size of the digital steps may be a digital value of 10, 100, 11, or any other appropriate digital value. In some embodiments, the size of the digital steps may change during performance of the trim procedure. For example, the size of the digital step may decrease as the key characteristic value approaches a boundary of the threshold range.

In some embodiments, a subsequent current value may be loaded into the storage elements each pulse of the clock signal/storage control signal. In these and other embodiments, the subsequent current value and the trim value may be changed each pulse of the clock signal/storage control signal until the key characteristic value is within the threshold range. In these and other embodiments, the threshold range may include the entire range of operational tolerance. Alternatively, the threshold range may only include a portion of the range of operational tolerance. When the key characteristic value is within the threshold range, the trim procedure may be stopped (e.g., end).

In some embodiments, the subsequent current value (e.g., a value that the trim value is to become) may be determined based on whether the key characteristic value is greater than or less than the threshold range. For example, if the key characteristic value is greater than the threshold range, the value signal may indicate that that subsequent current value, and subsequently the trim value of the trim signal, is to increase or decrease. By the same token and as another example, if the key characteristic value is less than the threshold range, the value signal may indicate that the current value, and subsequently the trim value of the trim signal, is to decrease or increase.

The embodiments described in the present disclosure may permit the trim procedure of the circuits under test to be performed quickly by reducing an amount of time between changes of the trim values of the trim signals and the subsequent current value in the storage elements. In addition, the embodiments described in the present disclosure may reduce the circuit footprint for performing the trim procedures by using a minimal number of circuit pads or a smaller ROM due to a lack of special trim firmware. Further, the embodiments described in the present disclosure may reduce production overhead by eliminating time used for programming embedded processors. Likewise, the trim procedures, according to some embodiments described in the present disclosure, may be customizable using trim procedures that are not pre-programmed. Trim procedures, according to some embodiments described in the present disclosure, may also test a circuit path to the circuits under test while performing the trim procedure.

These and other embodiments of the present disclosure will be explained with reference to the accompanying figures. It is to be understood that the figures are diagrammatic and schematic representations of such example embodiments, and are not limiting, nor are they necessarily drawn to scale. In the figures, features with like numbers indicate like structure and function unless described otherwise.

FIG. 1 illustrates an example system 100 for trimming one or more characteristics of a circuit under test 106, in accordance with at least one embodiment described in the present disclosure. The system 100 may include a production tester 102, a trim circuit 104, and the circuit under test 106. The production tester 102 may be electrically coupled to the trim circuit 104 and the circuit under test 106. In addition, the trim circuit 104 may be electrically coupled to the circuit under test 106.

The circuit under test 106 may include an analog circuit located on a die. In some embodiments, one or more analog components of the circuit under test 106 may be produced such that process variations occur within the analog components. In some embodiments, trimming of analog component characteristic values (e.g., key characteristic values) may be performed to cause the key characteristic values to be within the threshold ranges (e.g., the ranges of operational tolerances) so as to ensure proper operation of the circuit under test 106. The key signal characteristics may include signal frequencies, voltages, currents, or any other key signal characteristic of analog components within the circuit under test 106 that is designed to operate within threshold ranges. As another example, the trim procedures may be performed to trim (e.g., alter) impedances or other key characteristics of the analog components.

The trim circuit 104 may include a digital circuit. In some embodiments, the trim circuit 104 may be located on the same die as the circuit under test 106. In other embodiments, the trim circuit 104 may be located on a different die as the circuit under test 106. Further, in some embodiments, the trim circuit 104 may be positioned to be parallel to the circuit under test 106.

The production tester 102 and the trim circuit 104 may generate and provide signals to the trim circuit 104 and the circuit under test 106, respectively, to cause the key characteristic values to be trimmed (e.g., approach the threshold ranges). In addition, the production tester 102 may monitor and measure the key characteristic values. For example, the production tester 102 may monitor and measure a frequency of a signal generated by an oscillator within the circuit under test 106.

The trim circuit 104 may provide the trim signal at the trim value to the circuit under test 106. The trim signal and the trim value may be based on the signals received from the production tester 102. The one or more signals received from the production tester 102 are discussed in more detail below. The circuit under test 106 may receive the trim signal and cause one or more key characteristic values of the circuit under test 106 to be trimmed based on the trim value of the trim signal. For example, the trim value of the trim signal may cause the frequency of the signal generated by the oscillator to either increase or decrease accordingly.

In some embodiments, the analog components of the circuit under test 106 may be designed to be programmable using trimming components. For example, in some embodiments, the analog components may include one or more trimming components that may be permanently positioned to be on or off based on the trim value of the trim signal. For example, the trimming components may include transistors that operate as switches to change physical properties of the analog components in the circuit under test 106. In some embodiments, the circuit under test 106 may alter the key characteristic value by changing the state of the trimming components (e.g., either on to off or off to on based on the trim value of the trim signal).

In some embodiments, the production tester 102 may be electrically coupled to the trim circuit 104 via an interface 101. The production tester 102, via the interface 101, may provide the reset signal to the trim circuit 104. The reset signal may cause components within the trim circuit 104 to reset to pre-programmed initial values. Further, in response to the reset signal, the production tester 102 may determine an initial value of the key characteristic value. The reset signal is discussed in more detail below.

The production tester 102 may determine if the initial value of the key characteristic value is above, below, or within the threshold range. For example, the threshold range of the signal generated by the oscillator in the circuit under test 106 may be plus or minus five percent of ten MHz (e.g., 9.5 MHz-10.5 MHz) and the production tester 102 may determine how close the oscillator frequency is to the threshold range. In some embodiments, the threshold range of the key characteristic value may vary. In addition, in some embodiments, the threshold range of the key characteristic value may be determined by a designer of the circuit under test 106, by market-driven product requirements, and/or customer-driven product requirements.

The production tester 102, in response to measuring the initial value of the key characteristic value, may generate the one or more signals such that the trim circuit 104 adjusts the trim value of the trim signal. The trim circuit 104 may adjust the trim value to cause the key characteristic value to either increase or decrease based on whether the initial value of the key characteristic value was above or below the threshold range. Additionally or alternatively, if the initial value of the key characteristic value is within the threshold range, one or more signals that are generated by the production tester 102 may be altered such that performance of the trim procedure stops. In some embodiments, the trim signal may be provided to the circuit under test 106 such that the key characteristic value is altered each pulse of the clock signal/storage control signal, as discussed in more detail below. In some embodiments, the storage control signal may be a clock signal as discussed in more detail below.

In some embodiments, the production tester 102 may continuously monitor and measure the key characteristic value. Further, in these and other embodiments, the trim value may be altered based on the continuous monitoring and measuring of the key characteristic value. The key characteristic value may continuously be altered toward the threshold range based on the trim value being altered. This process may be repeated until the key characteristic value is within the threshold range. For example, with a threshold range of plus or minus five percent of ten MHz, the trim procedure of the oscillator may be repeated until the frequency of the signal generated by the oscillator is within a range of 9.5 MHz and 10.5 MHz.

In some embodiments, the production tester 102, in response to the key characteristic value being within the threshold range, may alter one or more signals to cause performance of the trim procedure to be stopped. In these and other embodiments, the production tester 102, in response to the key characteristic value being within the threshold range, may stop adjusting one or more signals to cause the trim value to remain constant.

Modifications, additions, or omissions may be made to FIG. 1 without departing from the scope of the present disclosure. For example, while the system 100 is illustrated as including a single production tester 102, the system 100 may include any number of production testers 102, such as two production testers 102 or three production testers 102. As another example, while the system 100 is illustrated as including a single trim circuit 104, the system 100 may include any number of trim circuits 104, such as three trim circuits 104 or seven trim circuits 104. As an additional example, while the system 100 is illustrated as including one circuit under test 106, the system 100 may include any number of circuits under test 106, such as three circuits under test 106 or five circuits under test 106.

Figure 2:
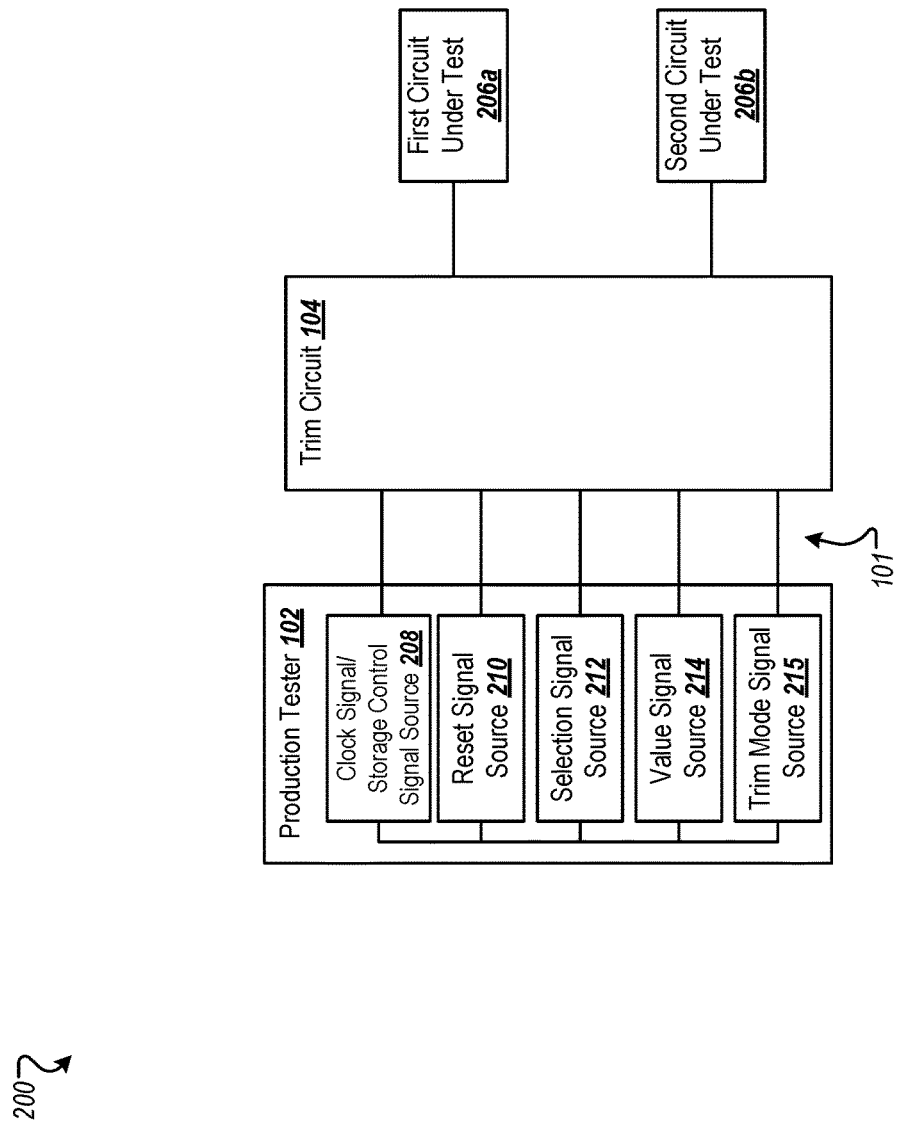
FIG. 2 illustrates another example system for trimming one or more characteristics of circuits under test.

FIG. 2 illustrates another example system 200 for trimming one or more characteristics of circuits under test 206, in accordance with at least one embodiment described in the present disclosure. The system 200 may include a first circuit under test 206a and a second circuit under test 206b (collectively referred to in the present disclosure as "circuits under test 206"). The production tester 102 may include a clock signal/storage control signal source 208, a reset signal source 210, a selection signal source 212, a value signal source 214, and a trim mode signal source 215. In some embodiments, the clock signal/storage control signal source 208, the reset signal source 210, the selection signal source 212, the value signal source 214, and the trim mode signal source 215 may be electrically coupled to the trim circuit 104 via the interface 101.

In some embodiments, interface 101 may include a parallel interface, a serial interface, or any other appropriate interface. For example, the interface 101 may include an I2C interface, a SPI interface, or any other appropriate type of interface. In other embodiments, the interface 101 may be located on the same die as the trim circuit 104.

In some embodiments, the production tester 102 may include instrumentation (not illustrated), a probe card (not illustrated), leads (not illustrated), and a socket (not illustrated). In these and other embodiments, the trim circuit 104 and the circuit under test 106 may be positioned on the probe card via a socket on the probe card. Further, in some embodiments, the trim circuit 104 and the circuits under test 206 may be electrically coupled to the socket via die pads coupled to the interface 101. The leads may electrically couple the socket to the instrumentation. The instrumentation may provide the one or more signals to the trim circuit 104 and measure the key characteristic value via the socket, the leads, and the probe card.

Figure 3:
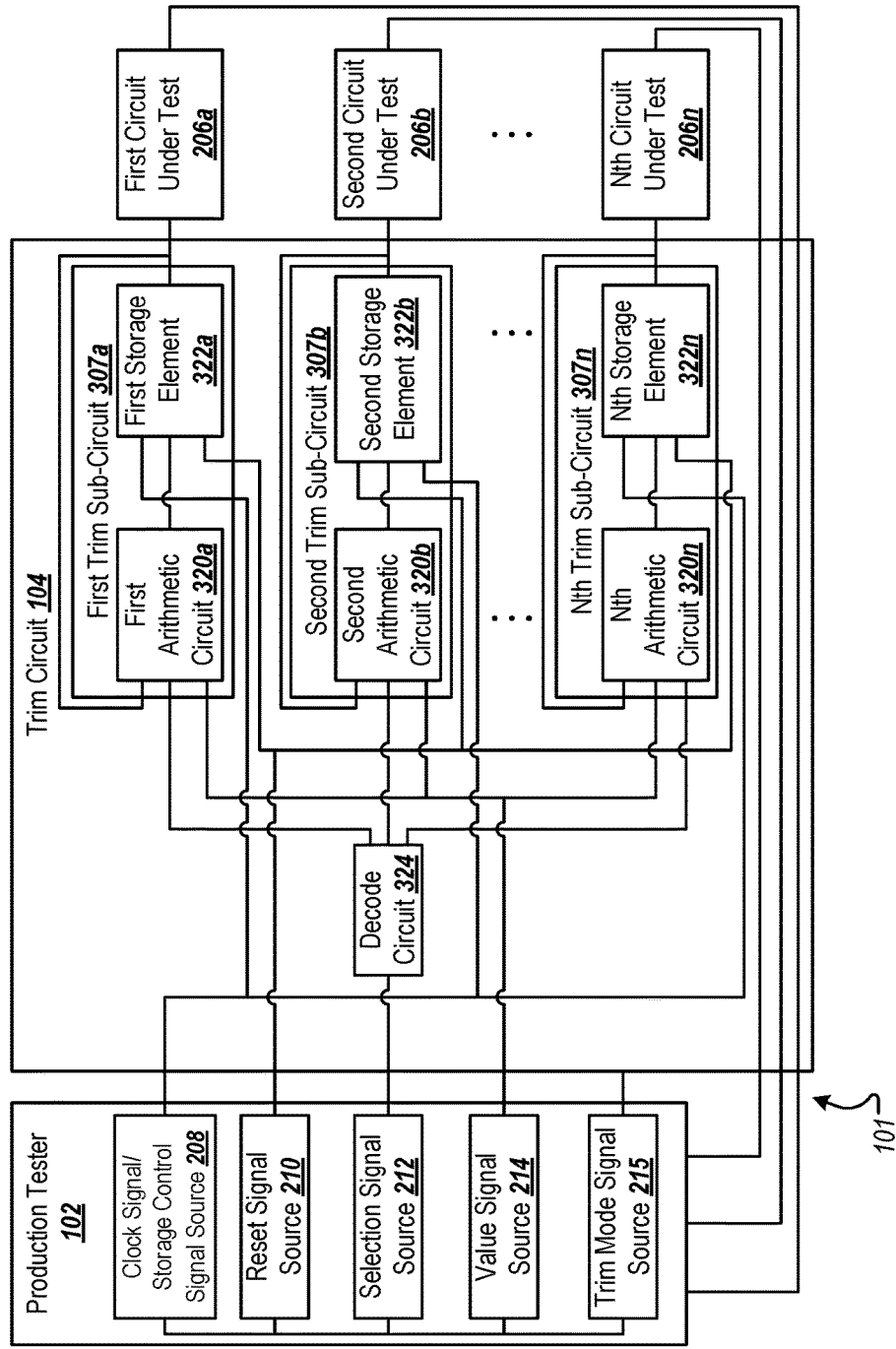
FIG. 3 illustrates yet another example system for trimming one or more characteristics of the circuits under test.

In some embodiments, the circuits under test 206 may be paired with a set of storage elements (the storage elements are illustrated in FIG. 3) in the trim circuit 104. In some embodiments, the storage elements may include digital registers (e.g., may include trim registers) for storing the subsequent current value (e.g., a number of bits of a digital value) for altering the trim value of the trim signal. The selection signal source 212 may generate the selection signal. The selection signal may indicate whether the first circuit under test 206a, the second circuit under test 206b, or both the first circuit under test 206a and the second circuit under test 206b are to have trim procedures performed.

The selection signal may include a digital signal representative of a digital value. In some embodiments, different digital values of the selection signal may indicate different circuits under test 206 that are to have trim procedures performed. For example, a digital value of 10 of the selection signal may indicate that the first circuit under test 206a is to have trim procedures performed. As another example, a digital value of 01 of the selection signal may indicate that the second circuit under test 206b is to have trim procedures performed. As yet another example, a digital value of 11 of the selection signal may indicate that both the first circuit under test 206a and the second circuit under test 206b are to have trim procedures performed.

The value signal source 214 may generate the value signal that indicates whether the trim value of the trim signal is to increase or decrease. In addition, in some embodiments, the value signal may indicate a size of a digital step that the trim value of the trim signal is to increase or decrease. The value signal may include a digital signal representative of a digital value. In some embodiments, the digital value of the value signal may indicate whether to increase, decrease, or maintain the trim value. For example, a digital value of 01 of the value signal may indicate that the trim value is to increase. As another example, a digital value of 10 of the value signal may indicate that the trim value is to decrease. As yet another example, a digital value of 11 of the value signal may indicate that the trim value is to be maintained.

The reset signal source 210 may generate the reset signal to cause components within the trim circuit 104 to reset to the pre-programmed initial values. In addition, in some embodiments, the reset signal may indicate that the trim procedure is to start. In other embodiments, a trim mode signal may be provided by the trim mode signal source 215 to indicate that the trim procedure is to start. In some embodiments, a digital value of the trim mode signal may be set as a digital high during the trim procedure. In some embodiments, the pre-programmed initial values of the components within the trim circuit 104 may be determined by the designer of the circuits under test 206. In these and other embodiments, the pre-programmed initial values may be determined such that the pre-programmed initial values permit the circuits under test 206 to operate properly.

In some embodiments, the reset signal may include a digital signal representative of a digital value. The digital value of the reset signal may indicate whether the components within the trim circuit 104 are to reset or not. For example, a digital value of 0 of the reset signal may indicate that the components within the trim circuit 104 are not to reset to the pre-programmed initial values. As another example, a digital value of 1 of the reset signal may indicate that the components within the trim circuit 104 are to reset to the pre-programmed initial values.

In some embodiments, the trim mode signal may include a digital signal representative of a digital value. The digital value of the trim mode signal may indicate whether the trim procedure is to be performed or not. For example, a digital value of 0 of the trim mode signal may indicate that the trim procedure is not to be performed. As another example, a digital value of 1 of the trim mode signal may indicate that the trim procedure is to be performed.

In some embodiments, the clock signal/storage control signal source 208 may provide a clock signal for operating components within the production tester 102, the trim circuit 104, or both the production tester 102 and the trim circuit 104. In these and other embodiments, the clock signal/storage control signal source 208 may provide a storage control signal for operating components within the trim circuit 104. In some embodiments, the clock signal/storage control signal source 208 may provide the storage control signal for storing the subsequent current values in the storage elements in the trim circuit 104. The storage elements are discussed in more detail below in relation to FIG. 3.

If the selection signal indicates that the trim procedure is to be performed for the first circuit under test 206a, the trim circuit 104 may generate a first trim signal at a first trim value for the first circuit under test 206a based on the clock signal/storage control signal and the value signal. In addition, if the selection signal indicates that the trim procedure is to be performed for the second circuit under test 206b, the trim circuit 104 may generate a second trim signal at a second trim value for the second circuit under test 206b based on the clock signal/storage control signal and the value signal. For example, if the selection signal indicates that only the first circuit under test 206a is to have trim procedures performed, the trim circuit 104 may only adjust the first trim value of the first trim signal. As another example, if the selection signal indicates that both the first circuit under test 206a and the second circuit under test 206b are to have trim procedures performed, the trim circuit 104 may initially adjust the first trim value of the first trim signal and then adjust the second trim value of the second trim signal.

An example of performing trim procedures for a single key characteristic value of the first circuit under test 206a will now be discussed. The reset signal source 210 may provide the reset signal to the trim circuit 104. One or more components within the trim circuit 104 may reset to the pre-programmed initial values based on the reset signal. In addition, the trim mode signal source 215 may provide the trim mode signal to the trim circuit 104. The selection signal source 212 may provide the selection signal indicating that only the first circuit under test 206a is to have trim procedures performed. The production tester 102 may determine the initial value of the key characteristic value. The production tester 102 may compare the initial value of the key characteristic value to the corresponding threshold range. The production tester 102 may determine if the initial value of the key characteristic value is greater than, less than, or within the threshold range.

If the initial value of the key characteristic value for the first circuit under test 206a is less than the threshold range, the value signal source 214 may generate the value signal indicating that the trim value of the first trim signal is to increase or decrease, depending on a configuration of a trim response of the first circuit under test 206a. The trim circuit 104 on the subsequent pulse of the clock signal/storage control signal, may store the subsequent current value as a digital value that is equal to one digital step greater or less than the pre-programmed initial value of the trim value. The trim circuit 104 may provide the trim signal with the trim value equal to the subsequent current value to the first circuit under test 206a.

The key characteristic value of the first circuit under test 206a may change based on the trim value of the trim signal. The production tester 102 may determine the current value of the key characteristic value (e.g., the value of the key characteristic value after being trimmed by a digital step). In addition, the production tester 102 may determine whether the current value of the key characteristic value is greater than, less than, or within the threshold range. If the current value of the key characteristic value is less than the threshold range, this process may be repeated using the current value of the trim value and the current value of the key characteristic value instead of the various initial values each subsequent pulse of the clock signal/storage control signal until the current value of the key characteristic value is greater than or within the threshold range.

If the initial value of the key characteristic value for the first circuit under test 206a is greater than the threshold range, the value signal source 214 may generate the value signal indicating that the trim value of the first trim signal is to decrease or increase, depending on the configuration of the trim response of the first circuit under test 206a. On a subsequent pulse of the clock signal/storage control signal, the trim circuit 104 may store the subsequent current value as a digital value that is equal to one digital step less or greater than the pre-programmed initial value of the trim value. The trim circuit 104 may provide the trim signal with the trim value equal to the subsequent current value.

The production tester 102 may determine whether the current value of the key characteristic value is greater than, less than, or within the threshold range. If the current value of the key characteristic value is greater than the threshold range, this process may be repeated using the current value of the trim value and the current value of the key characteristic value instead of the various initial values each subsequent pulse of the clock signal/storage control signal until the current value of the key characteristic value is less than or within the threshold range.

In some embodiments, if the initial value or subsequently the current value of the key characteristic value for the first circuit under test 206a is within the threshold range, the value signal source 214 may generate the value signal indicating that the trim value of the first trim signal is to be maintained. In other embodiments, if the initial value or the current value of the key characteristic value is within the threshold range, the selection signal source 212 may change the selection signal such that the trim circuit 104 stops adjusting the trim value of the trim signal.

In some embodiments, the size of the digital steps may be based on a difference between the key characteristic value and a closest boundary of the threshold range. In these and other embodiments, the change in the size of the digital steps may be greater if the difference between the key characteristic value and the closest boundary of the threshold range is greater than a threshold value. For example, if the frequency of the signal generated by the oscillator is initially 7.5 MHz and the threshold value is one MHz, the size of the digital step may be greater since the difference between the closest boundary of the threshold range (e.g., 9.5 MHz) is greater than 1 MHz (e.g., the difference is equal to two MHz).

Additionally, in some embodiments, the change in the size of the digital steps may be lesser if the difference between the key characteristic value and the closest boundary of the threshold range is less than the threshold value. For example, if the frequency of the signal generated by the oscillator is initially 8.7 MHz and the threshold value is one MHz, the size of the digital step may be lesser since the difference between the closest boundary of the threshold range (e.g., 9.5 MHz) is less than 1 MHz (e.g., the difference is equal to 0.8 MHz).

As an example, the change in the size of the digital steps that the trim value may change may be greater than or equal to 11 when the difference between the key characteristic value and the closest boundary of the threshold range is greater than the threshold value. As another example, the change in the size of the digital steps that the trim value may change may be equal to 01 when the difference between the key characteristic value and the closest boundary of the threshold range is less than the threshold value.

In some embodiments, as the current value of the key characteristic value approaches the threshold range, the size of the digital steps that the trim value may change may be altered. For example, the size of the digital steps that the trim value may change to be coarser (e.g., greater such as a size of the digital steps being equal to a high value or low value of four bits or more) if the difference between the initial value or the current value of the key characteristic value and the closest boundary of the threshold range is greater than the threshold value. As another example, the size of the digital steps that the trim value may be changed to may be finer (e.g., lesser such as a size of the digital steps being equal to a high value or low value of a single bit) if the difference between the initial value or the current value of the key characteristic value and the closest boundary of the threshold range is less than the threshold value.

In some embodiments, the size of the digital steps that the trim value may change may be altered based on user input. During performance of the trim procedure, the user may indicate via user input that the size of the digital steps is to increase or decrease.

Modifications, additions, or omissions may be made to FIG. 2 without departing from the scope of the present disclosure. For example, while the system 200 is illustrated as including a single production tester 102, the system 200 may include any number of production testers 102, such as two production testers 102 or three production testers 102. As another example, while the system 200 is illustrated as including a single trim circuit 104, the system 200 may include any number of trim circuits 104, such as three trim circuits 104 or seven trim circuits 104. As an additional example, while the system 200 is illustrated as including two circuits under test 206, the system 200 may include any number of circuits under test 206, such as three circuits under test 206 or five circuits under test 206. Further, while the production tester 102 is illustrated as including one clock signal/storage control signal source 208, one reset signal source 210, one selection signal source 212, and one value signal source 214, the production tester 102 may include any number of clock signal/storage control signal sources 208, reset signal sources 210, selection signal sources 212, or value signal sources 214.

FIG. 3 illustrates yet another example system 300 for trimming one or more characteristics of the circuits under test 206, in accordance with at least one embodiment described in the present disclosure.

The trim circuit 104 may include a decode circuit 324. The trim circuit 104 may also include a first trim sub-circuit 307a, a second trim sub-circuit 307b, and a $N^{th}$ trim sub-circuit 307n. In addition, the trim circuit 104 may include a first arithmetic circuit 320a, a second arithmetic circuit 320b, and a $N^{th}$ arithmetic circuit 320n (referenced collectively in the present disclosure as "arithmetic circuits 320"). As indicated by the ellipsis and the $N^{th}$ arithmetic circuit 320n in FIG. 3, the trim circuit 104 may include any appropriate number of arithmetic circuits 320. Further, the trim circuit 104 may include a first storage element 322a, a second storage elements 322b, and a $N^{th}$ storage element 322n (referenced collectively in the present disclosure as "storage elements 322"). As indicated by the ellipsis and the $N^{th}$ storage element 322n in FIG. 3, the trim circuit 104 may include any appropriate number of storage elements 322.

In some embodiments, the number of storage elements 322 and arithmetic circuits 320 may correspond to a number of circuits under test 206. For example, if the system 300 includes three circuits under test 206, the trim circuit 104 may include three arithmetic circuits 320 and three storage elements 322. In addition, in some embodiments, the number of storage elements 322 and arithmetic circuits 320 may correspond to a number of key characteristic values to be trimmed within the circuits under test 206. For example, there may be two circuits under test 206 and each circuit under test 206 may include two key characteristic values to be trimmed and there may be four arithmetic circuits 320 and four storage elements 322 in the trim circuit 104.

In some embodiments, the storage elements 322 may include one or more D flip flop circuits ("D flip flops"). The number of D flip flops in the storage elements 322 may correspond to a number of bits of the digital values that the trim values of the trim signals may be. For example, the trim values may include five bits of digital values and each of the storage elements 322 may include five D flip flops. As another example, the trim values may include eight bits of digital values and the storage elements 322 may include eight D flip flops.

The reset signal source 210 may provide the reset signal to the arithmetic circuits 320 and/or the storage elements 322. The arithmetic circuits 320 and/or the storage elements 322 may reset to the pre-programmed initial values. In some embodiments, the pre-programmed initial value may be a minimum digital value that may be loaded into the storage elements 322 (e.g., a digital value of 0). In other embodiments, the pre-programmed initial value may be a maximum digital value that may be loaded into the storage elements 322 (e.g., a digital value of 1111 if the storage elements 322 include four bits). Additionally or alternatively, the pre-programmed initial value may be any appropriate digital value between the minimum digital value and the maximum digital value that may be loaded into the storage elements 322 (e.g., a digital value of 1110, 1101, 1011, 0111, 0110, 0101, 0001, or any other appropriate four-bit digital value if the storage elements 322 include four bits). The selection signal source 212 may provide the selection signal to the decode circuit 324. The selection signal may indicate which of the circuits under test 206 are to have trim procedures performed (e.g., which of the trim values of the trim signals are to be adjusted).

The decode circuit 324 may generate one or more trim select signals based on the selection signal. In some embodiments, the decode circuit 324 may provide the trim select signals to each of the arithmetic circuits 320. For example, the decode circuit 324 may provide a first trim select signal to the first arithmetic circuit 320a, a second trim select signal to the second arithmetic circuit 320b, and an $N^{th}$ trim select signal to the $N^{th}$ arithmetic circuit 320n. In other embodiments, the decode circuit 324 may only provide the trim select signals to the arithmetic circuits 320 that correspond to circuits under test 206 that are to have trim procedures performed. For example, the decode circuit 324 may only provide the first trim signal to the first arithmetic circuit 320a if only the first circuit under test 206a is to have trim procedures performed.

In some embodiments, the trim select signals may be digital signals representative of digital values. In these and other embodiments, a particular digital value of the trim select signals may indicate that trim procedures are to be performed for the corresponding circuits under test 206. For example, the trim select signals may include a single bit and a digital value of 1 of a trim select signal may indicate that the corresponding circuit under test 206 is to have trim procedures performed. As another example, a digital value of 0 of a trim select signal may indicate that the corresponding circuit under test 206 is not to have trim procedures performed.

The arithmetic circuits 320 may receive the trim select signals. If the corresponding trim select signals indicate that trim procedures are to be performed for the corresponding circuits under test 206, the arithmetic circuits 320 may begin operation.

In some embodiments, the arithmetic circuits 320 may receive the trim signal at the current trim value and the value signal. In these and other embodiments, the arithmetic circuits 320 may operate as an adder, a subtractor, a divider, a multiplier, or any other appropriate arithmetic function based on the value signal. For example, if the value signal indicates that the trim value is to increase, the arithmetic circuits 320 may operate as adders or multipliers. As another example, if the value signal indicates that the trim value is to decrease, the arithmetic circuits 320 may operate as subtractors or dividers.

The arithmetic circuits 320 may generate subsequent trim signals representative of a digital value based on the corresponding current trim value and the value signal. For example, the first arithmetic circuit 320a may generate a first subsequent trim signal, the second arithmetic circuit 320b may generate a second subsequent trim signal, and the $N^{th}$ arithmetic circuit 320n may generate a $N^{th}$ subsequent trim signal. In some embodiments, the arithmetic circuits 320 may generate the subsequent trim signals representative of the digital value that is equal to the current trim value that is increased or decreased by a digital step.

In some embodiments. the arithmetic circuits 320 may perform the arithmetic function using the digital step as a digital value representative of a first bit applied to the current trim value (e.g., a digital value of 01). For example, if the current trim value is 00010, the arithmetic circuits 320 may add 01 to the current trim value causing the subsequent trim signals to be representative of a digital value of 00011. As another example, if the current trim value is 01000, the arithmetic circuits 320 may subtract 01 from the current trim value causing the subsequent trim signals to be representative of a digital value of 00111. In other embodiments, the arithmetic circuits 320 may perform the arithmetic function using the digital step as a value representative of a second, third, or greater bit to or from the current trim value (e.g., a digital value of 010, 100, 1000, etc.). For example, if the current trim value is 00010, the arithmetic circuits 320 may add 010 to the current trim value causing the subsequent trim signal to be representative of a digital value of 00100. As another example, if the current trim value is 01000, the arithmetic circuits 320 may subtract 0100 from the current trim value causing the subsequent trim signals to be representative of a digital value of 00100. As yet another example, if the current trim value is 00100, the arithmetic circuits 320 may multiply the current trim value by a digital value of 010 causing the subsequent trim signal to be representative of a digital value of 01000. Further, as another example, if the current trim value is 01001, the arithmetic circuits 320 may divide the current trim value by a digital value of 011 causing the subsequent trim signal to be representative of a digital value of 00011.

In some embodiments, the storage elements 322 may receive the subsequent trim signals and the clock signal/ storage control signal. In other embodiments, the storage elements 322 may receive the subsequent trim signals and the storage control signal. In some embodiments, the storage elements 322 may store a digital value (e.g., the subsequent current value) representative of the trim value of the corresponding subsequent trim signals. For example, if the trim value of the subsequent trim signals is 00010, the storage elements 322 may store the subsequent current value representative of 00010. In some embodiments, the storage elements 322 may store the subsequent current value as a digital voltage.

In some embodiments, the storage elements 322 may store (e.g., update) the subsequent current value each pulse of the clock signal or the storage control signal. Thus, the trim value of the trim signals provided to the circuits under test 206 may also be altered each pulse of the clock signal or storage control signal during trim procedures. In addition, in some embodiments, the trim signals may be provided to the circuits under test 206 such that the current value of the key characteristic values are trimmed each pulse of the clock signal/storage control signal. This process may be repeated until the current value of the key characteristic value is within the corresponding threshold ranges.

In some embodiments, trim procedures for each of the circuits under test 206 may be performed simultaneously. In other embodiments, trim procedures for the circuits under test 206 may be performed one circuit under test 206 at a time. For example, the trim procedure for the circuits under test 206 may be performed in a hierarchical order (e.g., the first circuit under test 206a first and the second circuit under test 206b second, etc.). In these other embodiments, the trim procedures for the circuits under test 206 may be performed for each key characteristic type simultaneously. For example, trim procedures for a voltage (e.g. a bandgap voltage) in the circuits under test 206 may be performed first and then trim procedures for a frequency of a signal generated by an oscillator may be performed second.

An example of performing trim procedures for a single key characteristic value of the second circuit under test 206b will now be discussed. The trim mode signal source 215 may provide the trim mode signal to the trim circuit 104. The reset signal source 210 may provide the reset signal to the trim circuit 104. The arithmetic circuits 320 and/or the storage elements 322 may reset to the pre-programmed initial values. The selection signal source 212 may provide the selection signal indicating that the second circuit under test 206b is to have trim procedures performed. The decode circuit 324 may generate the trim select signals indicative that only the second circuit under test 206b is to have trim procedures performed. For example, the decode circuit 324 may provide the first trim select signal to the first arithmetic circuit 320a as a digital low to prevent the first arithmetic circuit 320a from operating and the second trim select signal to the second arithmetic circuit 320b as a digital high to cause the second arithmetic circuit 320b to operate.

The production tester 102 may determine the initial value of the key characteristic value for the second circuit under test 206b. The production tester 102 may compare the initial value of the key characteristic value to the threshold range. The production tester 102 may determine if the initial value of the key characteristic value is greater than, less than, or within the threshold range.

If the initial value of the key characteristic value for the second circuit under test 206b is less than the threshold range, the value signal source 214 may generate the value signal indicating that the trim value of the second trim signal is to increase or decrease depending on the configuration of the trim response of the second circuit under test 206b. The second arithmetic circuit 320b may add the digital step to the initial trim value, subtract the digital step from the initial trim value, multiply the initial trim value by the digital step, divide the initial trim value by the digital step, or any other appropriate arithmetic function using the digital step to generate the subsequent trim signal with the increased or decreased trim value (e.g., adjusted trim value). On the subsequent pulse of the storage control signal, the second storage element 322b may store the subsequent current value representative of the increased or decreased trim value of the subsequent trim signal. In addition, the second storage element 322b may provide the trim signal at the trim value equal to the subsequent current value stored in the second storage element 322b to the second circuit under test 206b.

The key characteristic value of the second circuit under test 206b may change based on the trim value of the second trim signal. The production tester 102 may determine the current value of the key characteristic value. In addition, the production tester 102 may determine whether the current value of the key characteristic value is greater than, less than, or within the threshold range. If the current value of the key characteristic value is less than the threshold range, this process may be repeated using the subsequent current value stored in the second storage element 322b, the current value of the trim value, and the current value of the key characteristic value instead of the various initial values each subsequent pulse of the clock signal/storage control signal until the current value of the key characteristic value for the second circuit under test 206b is greater than or within the threshold range.

If the initial value of the key characteristic value for the second circuit under test 206b is greater than the threshold range, the value signal source 214 may generate the value signal indicating that the trim value of the second trim signal is to decrease or increase depending on the configuration of the trim response of the second circuit under test 206b. The second arithmetic circuit 320b may add the digital step to the initial trim value, subtract the digital step from the initial trim value, multiply the initial trim value by the digital step, divide the initial trim value by the digital step, or any other appropriate arithmetic function using the digital step to generate the subsequent trim signal with the decreased or increased trim value. On the subsequent pulse of the storage control signal, the second storage element 322b may store the subsequent current value representative of the decreased or increased trim value of the subsequent trim signal and may provide the trim signal at the trim value equal to the subsequent current value stored in the second storage element 322b to the second circuit under test 206b.

The production tester 102 may determine the current value of the key characteristic value. In addition, the production tester 102 may determine whether the current value of the key characteristic value is greater than, less than, or within the threshold range. If the current value of the key characteristic value is greater than the threshold range, this process may be repeated using the subsequent current value stored in the second storage elements 322b, the current value of the trim value, and the current value of the key characteristic value instead of the various initial values each subsequent pulse of the clock signal/storage control signal until the current value of the key characteristic value is less than or within the threshold range.

In some embodiments, if the initial value or subsequently the current value of the key characteristic value for the second circuit under test 206b is within the threshold range, the value signal source 214 may generate the value signal indicating that the trim value of the second trim signal is to be maintained. In other embodiments, if the initial value or the current value of the key characteristic value for the second circuit under test 206b is within the threshold range, the selection signal source 212 may generate the selection signal indicating to stop performing the trim procedure.

In some embodiments, an example of the logical flow of the operation of the arithmetic circuits 320 may be represented as follows:

if (sel_trim_i) then
    if (value select indicates increase) then
      nxt_trim_val_i=cur_trim_val_i+digital_step
    else
      nxt_trim_val_i=cur_trim_val_i−digital_step
  else
    nxt_trim_val_i=cur_trim_val_i In the logic flow, sel_trim_i may be representative of the corresponding circuit under test 206 that trim procedures are to be performed, value select indicates increase may be the value signal if it indicates that the trim value is to increase, nxt_trim_val_i may be the trim value of the subsequent trim signal, cur_trim_val_i may be the current trim value of the trim signal, and digital step may be the size of the digital step to be added or subtracted from the current trim value of the trim signal.

Modifications, additions, or omissions may be made to FIG. 3 without departing from the scope of the present disclosure. For example, while the system 300 is illustrated as including a single production tester 102, the system 300 may include any number of production testers 102, such as two production testers 102 or three production testers 102. As another example, while the system 300 is illustrated as including a single trim circuit 104, the system 300 may include any number of trim circuits 104, such as three trim circuits 104 or seven trim circuits 104. As an additional example, while the production tester 102 is illustrated as including one clock signal/storage control signal source 208, one reset signal source 210, one selection signal source 212, and one value signal source 214, the production tester 102 may include any number of clock signal/storage control signal sources 208, reset signal sources 210, selection signal sources 212, and value signal sources 214.

Figure 4:
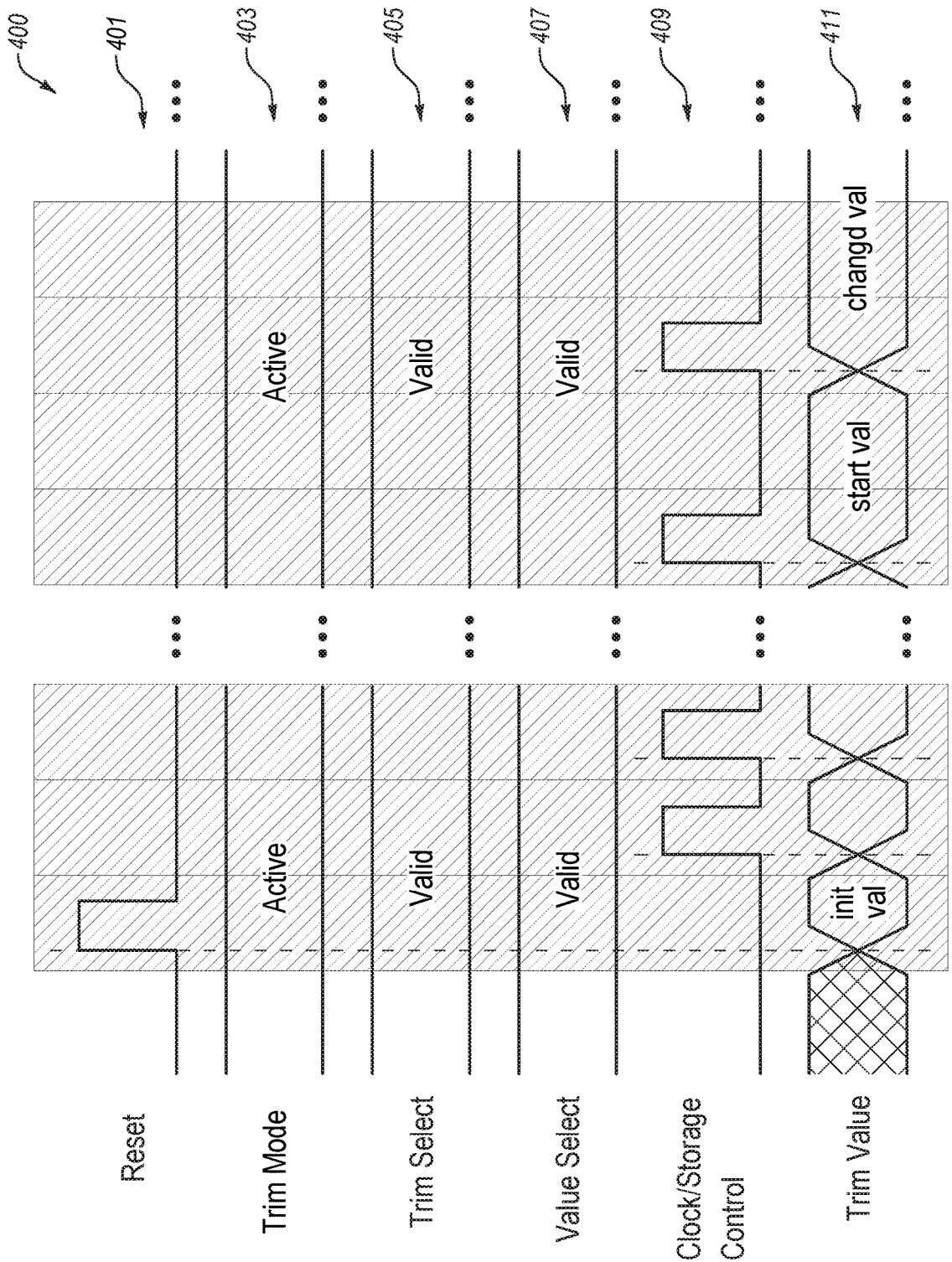
FIG. 4 illustrates a graphical representation of example signal timing for trimming a characteristic value of the circuits under test.

FIG. 4 illustrates a graphical representation 400 of example signal timing for trimming a characteristic value of the circuits under test 206, in accordance with at least one embodiment disclosed in the present disclosure. More specifically, FIG. 4 shows the trim value of a trim signal changing from an initial value to a start value and subsequently to a changed value all on a rising edge of the clock signal/storage control signal.

In FIG. 4, waveform 401 may represent the waveform of the reset signal during trim procedures. When waveform 401 rises, the components within the trim circuit 104 (e.g., the arithmetic circuits 320 and/or the storage elements 322) may reset to the pre-programmed initial values. Waveform 401 is illustrated as having a digital high to reset the components within the trim circuit 104. The reset signal may include a digital low to reset the components within the trim circuit 104. Waveform 403 may represent the waveform of the trim mode signal during trim procedures. Waveform 403, as illustrated in FIG. 4, indicates that the trim mode signal may include any valid digital value for indicating that trim procedures are to be performed (e.g., trim procedures are active). Waveform 405 may represent the waveform of the selection signal. Waveform 405, as illustrated in FIG. 4, indicates that the selection signal may include any valid digital value for identifying the circuits under test 206 that are to have trim procedures performed. Waveform 407 may represent the waveform of the value signal. Waveform 407, as illustrated in FIG. 4, indicates that the value signal may include any valid digital value for indicating that the trim value is to increase or decrease. In addition, waveform 407, as illustrated in FIG. 4, indicates the size of the digital step that the trim value of the trim signal is to increase or decrease. Waveform 409 may represent the waveform of the clock signal/storage control signal.

Waveform 411 may represent the current value stored in the storage elements 322. As illustrated in FIG. 4, the digital value of the current value stored in the storage elements 322 may, in response to the reset signal, be equal to a pre-programmed initial value. Waveform 411 (e.g., the current value stored in the storage elements 322) may change each pulse of waveform 409 until achieving a start value (e.g., the initial value of the trim value illustrated as "start val" in FIG. 4), that ensures that the corresponding circuits under test 206 operates properly. On a subsequent pulse of waveform 409

(e.g., the subsequent pulse of the clock signal/storage control signal), the digital value of waveform 411 may change based on the state of waveform 407 (e.g., the trim value may change based on the digital value of the value signal). On the subsequent pulse of waveform 409, the digital value of waveform 411 may increase or decrease accordingly. For each pulse of waveform 409, the digital value of waveform 411 may increase or decrease until the corresponding key characteristic value is within the threshold range.

The vertical bars illustrated in FIG. 4 indicate tester cycles. A modification to any one of the waveforms 401, 403, 405, 407, 409, 411 may occur within each tester cycle. All of the tester cycles combined may be a test program (e.g., a trim procedure program). As indicated by the ellipsis in FIG. 4, the test program may include any appropriate number of tester cycles.

Figure 5:
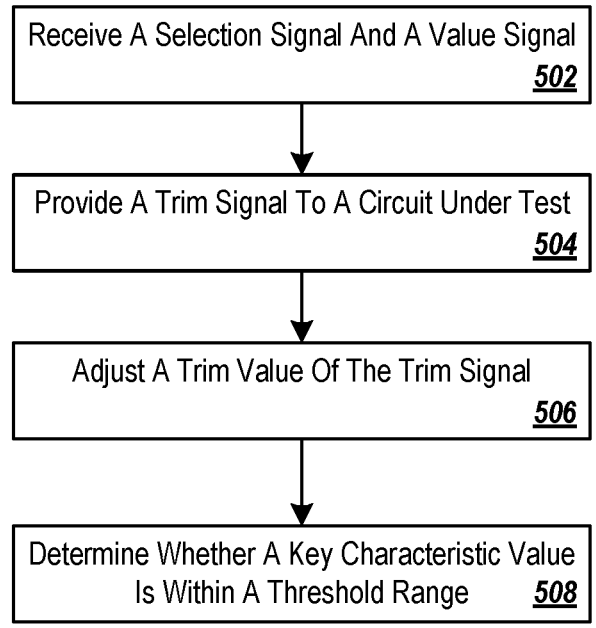
FIG. 5 illustrates a flowchart of an example method of trimming a characteristic value of a circuit under test, all in accordance with at least one embodiment described in the present disclosure.

FIG. 5 illustrates a flowchart of an example method 500 of trimming a characteristic value of a circuit under test 106, 206, in accordance with at least one embodiment disclosed in the present disclosure. Method 500 may be performed by any suitable system, apparatus, or device with respect to trimming the characteristic value of the circuit under test 106, 206. For example, the production tester 102, the trim circuit 104, and the circuits under test 106, 206 of FIGS. 1-3 may perform or direct performance of one or more of the operations associated with the method 500 with respect to trimming the characteristic value of the circuit under test 106, 206. Although illustrated with discrete blocks, the steps and operations associated with one or more of the blocks of the method 500 may be divided into additional blocks, combined into fewer blocks, or eliminated, depending on the particular implementation.

The method 500 may include a block 502, at which a selection signal and a value signal may be received. For example, the production tester 102 of FIGS. 1-3 may provide the selection signal and the value signal and the trim circuit 104 of FIGS. 1-3 may receive the selection signal and the value signal. At block 504, a trim signal may be provided to a circuit under test. For example, the trim circuit 104 of FIGS. 1-3 may provide the trim signal at the trim value to the circuits under test 106, 206 of FIGS. 1-3.

At block 506, a trim value of the trim signal may be adjusted. The trim value of the trim signal may be adjusted based on the selection signal and the value signal. In some embodiments, the trim signal may cause the key characteristic value of the circuit under test to be trimmed (e.g., changed) based on the adjusted trim value. At block 508, it may be determined whether the key characteristic value is within the threshold range. If the key characteristic value is within the threshold range, the method 500 may also include stopping performance of the trim procedure on the circuit under test. If the key characteristic value is not within the threshold range, the method 500 may also include adjusting the value signal. The value signal may be adjusted based on whether the key characteristic value is greater than or less than the threshold range.

Modifications, additions, or omissions may be made to the method 500 without departing from the scope of the present disclosure. For example, the operations of method 500 may be implemented in differing order. Additionally or alternatively, two or more operations may be performed at the same time. Furthermore, the outlined operations and actions are only provided as examples, and some of the operations and actions may be optional, combined into fewer operations and actions, or expanded into additional operations and actions without detracting from the essence of the disclosed embodiments.

Figure 6:
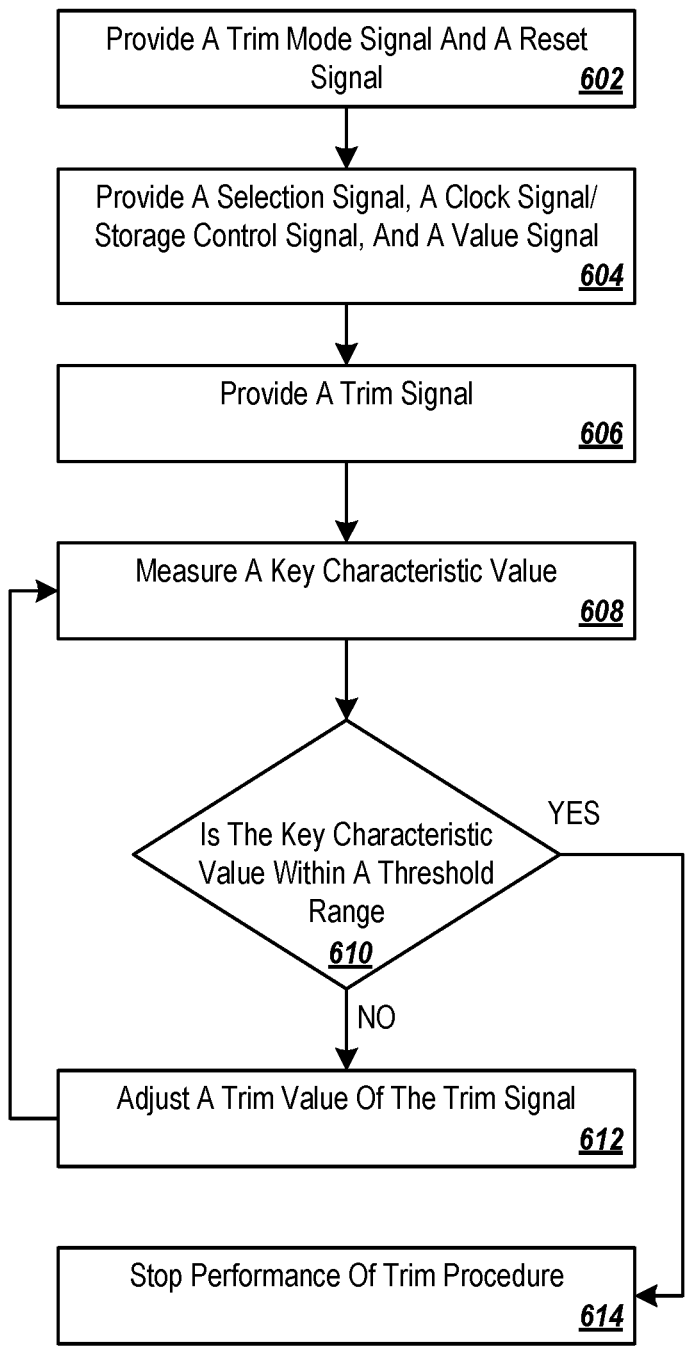
FIG. 6 illustrates a flowchart of an example method of trimming the key characteristic value of the circuit under test.

FIG. 6 illustrates a flowchart of an example method 600 of trimming the key characteristic value of the circuit under test 106, 206, in accordance with at least one embodiment disclosed in the present disclosure. Method 600 may be performed by any suitable system, apparatus, or device with respect to trimming the key characteristic value of the circuit under test 106, 206. For example, the production tester 102, the trim circuit 104, and the circuits under test 106, 206 of FIGS. 1-3 may perform or direct performance of one or more of the operations associated with the method 600 with respect to trimming the key characteristic value of the circuit under test 106, 206. Although illustrated with discrete blocks, the steps and operations associated with one or more of the blocks of the method 600 may be divided into additional blocks, combined into fewer blocks, or eliminated, depending on the particular implementation.

The method 600 may include a block 602, at which the trim mode signal and the reset signal may be provided. In some embodiments, the trim mode signal and the reset signal may be provided to the trim circuit. In these and other embodiments, the trim mode signal may indicate that the trim procedure of the circuit under test is to be performed. Additionally or alternatively, the reset signal may cause components within the trim circuit to reset to the pre-programmed initial values. As an example, the trim mode signal source 215 of FIGS. 2 and 3 may provide the trim mode signal to the trim circuit 104 of FIGS. 2 and 3. As another example, the reset signal source 210 of FIGS. 2 and 3 may provide the reset signal to the trim circuit 104 of FIGS. 2 and 3. Block 602 may be followed by block 604.

At block 604, the selection signal, the clock signal/storage control signal, and the value signal may be provided. In some embodiments, the selection signal, the clock signal/storage control signal, and the value signal may be provided to the trim circuit. In these and other embodiments, the selection signal may indicate that the circuit under test is to have the trim procedure performed. In these and other embodiments, the clock signal/storage control signal may control operation of components within the trim circuit. Additionally, in some embodiments, the value signal may indicate whether the trim value of the trim signal is to increase or decrease and a size of the digital step that the trim value is to change. As an example, the clock signal/storage control signal source 208 of FIGS. 2 and 3 may provide the clock signal/storage control signal to the trim circuit 104 of FIGS. 2 and 3. As another example, the selection signal source 212 of FIGS. 2 and 3 may provide the selection signal to the trim circuit 104 of FIGS. 2 and 3. As yet another example, the value signal source 214 of FIGS. 2 and 3 may provide the value signal to the trim circuit 104 of FIGS. 2 and 3. Block 604 may be followed by block 606.

At block 606, the trim signal may be provided. In some embodiments, the trim signal may be provided at the trim value to the circuit under test. In these and other embodiments, the trim circuit may provide the trim signal. As an example, the trim circuit 104 of FIGS. 1-3 may provide the trim signal to the circuits under test 106, 206 of FIGS. 1-3. Block 606 may be followed by block 608.

At block 608, the key characteristic value may be measured. For example, the production tester 102 of FIGS. 1-3 may be electrically coupled to the circuits under test 106, 206 of FIGS. 1-3 and may measure the key characteristic value. Block 608 may be followed by block 610.

At block 610, it may be determined whether the key characteristic value is within the threshold range. If the key characteristic value is within the threshold range, block 610 may be followed by block 614. If the key characteristic value is not within the threshold range, block 610 may be followed by block 612.

At block 612, the trim value of the trim signal may be adjusted. In some embodiments, the trim value may be adjusted based on the selection signal and the value signal. In these and other embodiments, the trim value may be stored based on the clock signal/storage control signal. For example, if the selection signal indicates that the trim procedure was not to be performed, the trim value may be maintained. As another example, if the selection signal indicates that the trim procedure is to be performed, the value signal may cause the trim value to either increase or decrease. In some embodiments, the trim signal may cause the key characteristic value of the circuit under test to be trimmed (e.g., changed) based on the adjusted trim value. Block 612 may be followed by block 608. Blocks 608, 610, and 612 may be repeated until the key characteristic value is within the threshold range.

At block 614, performance of the trim procedure may be stopped.

Modifications, additions, or omissions may be made to the method 600 without departing from the scope of the present disclosure. For example, the operations of method 600 may be implemented in differing order. Additionally or alternatively, two or more operations may be performed at the same time. Furthermore, the outlined operations and actions are only provided as examples, and some of the operations and actions may be optional, combined into fewer operations and actions, or expanded into additional operations and actions without detracting from the essence of the disclosed embodiments.

In accordance with common practice, the various features illustrated in the drawings may not be drawn to scale. The illustrations presented in the present disclosure are not meant to be actual views of any particular apparatus (e.g., device, system, etc.) or method, but are merely representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," among others).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

Additionally, the use of the terms "first," "second," "third," etc., are not necessarily used in the present disclosure to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited in the present disclosure are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A system for performing a trim procedure on a circuit under test, the system comprising:
   a trim circuit configured to:
      provide a trim signal to the circuit under test; and
      adjust a trim value of the trim signal based on a selection signal and a value signal, the trim signal causes a key characteristic value of the circuit under test to change based on the adjusted trim value; and
   a production tester configured to determine whether the key characteristic value is within a threshold range:
      responsive to the key characteristic value being within the threshold range, the production tester is configured to stop performing a trim procedure on the circuit under test; and
      responsive to the key characteristic value not being within the threshold range, the production tester is configured to adjust the value signal based on whether the key characteristic value is greater than or less than the threshold range.

2. The system of claim 1, wherein the trim circuit is a first trim sub-circuit of the trim circuit, the trim signal is a first trim signal, the key characteristic value is a first key characteristic value, the circuit under test is a first circuit under test, and responsive to the key characteristic value being within the threshold range, the trim circuit continues to provide the first trim signal to the first circuit under test, the trim circuit further comprising:
   a second trim sub-circuit configured to:
      provide a second trim signal to a second circuit under test; and
      adjust the trim value of the second trim signal based on the selection signal and the value signal, the second trim signal causes a second key characteristic value of the second circuit under test to change based on the adjusted trim value of the second trim signal, wherein the production tester is further configured to determine whether the second key characteristic value is within the threshold range:
      responsive to the second key characteristic value being within the threshold range, the production tester is further configured to stop performing the trim procedure on the second circuit under test; and
      responsive to the second key characteristic value not being within the threshold range, the production tester is further configured to adjust the value signal based on whether the second key characteristic value is greater than or less than the threshold range.

3. The system of claim 2, wherein the selection signal indicates whether the first circuit under test, the second circuit under test, or both the first circuit under test and the second circuit under test are to have trim procedures performed.

4. The system of claim 2, wherein the system further comprises a decode circuit configured to:
   receive the selection signal from the production tester, the selection signal indicates which circuit under test is to have trim procedures performed; and
   provide trim select signals to the first trim sub-circuit and the second trim sub-circuit based on the selection signal.

5. The system of claim 1, wherein the trim circuit comprises:
   an arithmetic circuit configured to:
      receive the selection signal, the value signal, and the trim signal; and
      provide a subsequent trim signal based on the value signal and the trim signal; and
   a storage element configured to:
      receive the subsequent trim signal and a storage control signal; and
      provide the trim signal to the circuit under test based on the subsequent trim signal and the storage control signal, wherein a subsequent current value of the subsequent trim signal is adjusted based on the value signal such that the trim value of the trim signal adjusts accordingly.

6. The system of claim 1, wherein the trim circuit is further configured to receive a reset signal, wherein responsive to receiving the reset signal, at least the trim value is set to an initial value that is pre-programmed in the trim circuit.

7. The system of claim 6, wherein the trim circuit is configured to receive a storage control signal and responsive to a pulse of the storage control signal, the value signal indicates whether the trim value is to increase or decrease from the initial value and a size of a digital step that the trim value is to increase or decrease from the initial value.

8. The system of claim 7, wherein responsive to each subsequent pulse of the storage control signal, the trim circuit is configured to either increase or decrease the trim value based on the value signal.

9. The system of claim 1, wherein the trim circuit is a digital circuit and the circuit under test is an analog circuit.

10. The system of claim 1, wherein the trim circuit is further configured to receive a trim mode signal, wherein responsive to receiving the trim mode signal, the trim circuit in configured to perform the trim procedure.

11. The system of claim 1, wherein the trim circuit is further configured to receive a trim mode signal, wherein the trim mode signal indicates that a trim procedure of the key characteristic value is to be performed.

12. A method for performing a trim procedure on a circuit under test, the method comprising:
   receiving a selection signal and a value signal;
   providing a trim signal to the circuit under test; and
   adjusting a trim value of the trim signal based on the selection signal and the value signal, the trim signal causes a key characteristic value of the circuit under test to change based on the adjusted trim value; and
   determining whether the key characteristic value is within a threshold range, wherein:
      responsive to the key characteristic value being within the threshold range, the method further comprises stopping performance of a trim procedure on the circuit under test; and
      responsive to the key characteristic value not being within the threshold range, the method further comprises adjusting the value signal based on whether the key characteristic value is greater than or less than the threshold range.

13. The method of claim 12, wherein the trim signal is a first trim signal, the key characteristic value is a first key characteristic value, the circuit under test is a first circuit under test, the method further comprising:
   responsive to the key characteristic value being within the threshold range, continuing to provide the first trim signal to the first circuit under test,
   providing a second trim signal to a second circuit under test;
   adjusting the trim value of the second trim signal based on the selection signal and the value signal, the second trim signal causes a second key characteristic value of the second circuit under test to change based on the adjusted trim value of the second trim signal; and
   determining whether the second key characteristic value is within the threshold range, wherein:
      responsive to the second key characteristic value being within the threshold range, the method further comprises stopping performance of the trim procedure on the second circuit under test; and
      responsive to the second key characteristic value not being within the threshold range, the method further comprises adjusting the value signal based on whether the second key characteristic value is greater than or less than the threshold range.

14. The method of claim 13, wherein the selection signal indicates whether the first circuit under test, the second circuit under test, or both the first circuit under test and the second circuit under test are to have trim procedures performed.

15. The method of claim 13, further comprising:
   receiving the selection signal that indicates which circuit under test is to have trim procedures performed; and generating trim select signals based on the selection signal.

16. The method of claim 13, further comprising:
generating a subsequent trim signal based on the selection signal, the value signal, and the trim signal; and
providing the trim signal to the circuit under test based on the subsequent trim signal, wherein a subsequent current value of the subsequent trim signal is adjusted based on the value signal such that the trim value of the trim signal adjusts accordingly.

17. The method of claim 12, further comprising receiving a reset signal, wherein at least the trim value is set to an initial value based on the reset signal.

18. The method of claim 17, further comprising receiving a storage control signal, wherein responsive to a pulse of the storage control signal, the method comprises adjusting the trim value from the initial value.

19. The method of claim 18, wherein responsive to each subsequent pulse of the storage control signal, the method further comprises further adjusting the trim value based on the value signal.

20. The method of claim 12 further comprising:
receiving a trim mode signal; and
performing the trim procedure based on the trim mode signal.

* * * * *